(12) United States Patent
Gollub

(10) Patent No.: US 7,900,100 B2
(45) Date of Patent: Mar. 1, 2011

(54) UNCORRECTABLE ERROR DETECTION UTILIZING COMPLEMENTARY TEST PATTERNS

(75) Inventor: Marc A. Gollub, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 1044 days.

(21) Appl. No.: 11/677,214

(22) Filed: Feb. 21, 2007

(65) Prior Publication Data

US 2008/0201620 A1    Aug. 21, 2008

(51) Int. Cl.
*G11C 29/00*    (2006.01)
(52) U.S. Cl. .................. 714/718; 714/785; 714/715
(58) Field of Classification Search .............. 714/718, 714/719, 715, 735, 785
See application file for complete search history.

(56) References Cited

U.S. PATENT DOCUMENTS

| | | | |
|---|---|---|---|
| 4,485,471 A | 11/1984 | Singh et al. | |
| 5,157,669 A | 10/1992 | Yu et al. | |
| 5,610,929 A | 3/1997 | Yamamoto | |
| 6,009,548 A | 12/1999 | Chen et al. | |
| 2002/0191520 A1* | 12/2002 | Nagata et al. | 369/59.23 |
| 2005/0160332 A1* | 7/2005 | Hirabayashi | 714/718 |

OTHER PUBLICATIONS

IBM TDB "Unique Method for Reporting Errors Detected/Corrected by ECC Circuitry"; Sep. 1993; v36 n9A; p. 563-564.
IBM TDB "Concurrent On Line Array Chip Sparing from Scrub Assisted Fault Data"; Dec. 1991; v34 n7A; p. 16-19.
IBM TDB "Intermittent Error Isolation in a Double Error Environment"; May 1973; v15 n12; p. 3853.
IBM TDB "Fault Data Collection"; Aug. 1985; v28 n3; p. 1075-1078.
IBM TDB "Firmware with Error Correction Code for Logic/Array Testing"; Nov. 1983; v26 n6; p. 3085-3087.

* cited by examiner

*Primary Examiner* — Guy J Lamarre
(74) *Attorney, Agent, or Firm* — Dillon & Yudell LLP

(57) ABSTRACT

A system, method and program product for utilizing error correction code (ECC) logic to detect multi-bit errors. In one embodiment, a first test pattern and a second test pattern are applied to a set of hardware bit positions. The first and second patterns are multiple logic level patterns and the second test pattern is the logical complement of the first test pattern. The first and second test patterns are utilized by the ECC logic to detect correctable errors having n or fewer bits. One or more bit positions of a first correctable error occurring responsive to applying the first test pattern are determined and one or more bit positions of a second correctable error occurring responsive to applying the second test pattern are determined. The determined bit positions of the first and second correctable errors are processed to identify a multiple-bit error within the set of hardware bit positions.

18 Claims, 5 Drawing Sheets

215

| MEMORY ADDRESS | PATTERN ID | INVERSE PATTERN ID | TEST CYCLE # | ERROR BIT(S) |
|---|---|---|---|---|
| line AA | pattern x | pattern /x | CYCLE_M | b1 |
| line AA | pattern x | pattern/x | CYCLE_N | b1, b3 |
| line BB | pattern y | pattern /y | CYCLE_O | b0 |
| line BB | pattern /y | pattern y | CYCLE_P | b7 |
| ⋮ | ⋮ | ⋮ | ⋮ | ⋮ |

| MEMORY ADDRESS | BIT | COUNT | FREQ | BIT | COUNT | FREQ |
|---|---|---|---|---|---|---|
| line BB | b0 | 0100 | 1.000 | b7 | 0100 | 1.000 |
| ⋮ | ⋮ | ⋮ | ⋮ | ⋮ | ⋮ | ⋮ |

FIG. 4B

UNCORRECTABLE ERROR DETECTION UTILIZING COMPLEMENTARY TEST PATTERNS

BACKGROUND OF THE INVENTION

1. Technical Field

The present invention relates generally to error correction codes, and in particular, to utilizing correctable error analysis to identify otherwise undetected multi-bit errors.

2. Description of the Related Art

Many hardware diagnostic tests for memory arrays or buses rely on hardware-generated error correction codes (ECCs) which detect and correct single-bit errors known as correctable errors (CEs). Such ECCs are often further enabled to detect, but not correct, multi-bit errors known as uncorrectable errors (UEs). A primary goal of ECC diagnostics testing is to identify the locations of UEs so that hardware containing UEs can be deconfigured.

Robust ECC testing procedures have long been recognized as a practical necessity for main storage on large scale computer systems such as the S/390 Parallel Enterprise Server systems available from IBM Corporation. S/390 and IBM are registered trademarks, and S/390 Parallel Enterprise Server is a trademark of IBM Corporation. Since the main storage on such large systems often serves as the central data repository accessed by disparate users throughout an enterprise, the criticality of preserving the integrity of the massive amount of data stored on such large systems is readily apparent.

Hardware-generated ECC results are generated and processed with respect to individual test patterns. Therefore, an UE will only be detected if a test pattern applies logic levels to the faulty bit locations that are opposite the levels the faulty bits are stuck at. An UE is easily detected if it comprises two bits that are stuck at the same logic level. In such cases, a uniform pattern of either all logic lows or all highs (e.g. 0x00000000 or 0xFFFFFFFF) will expose the UE. If, however, one of the faulty bits is stuck high and another of the faulty bits is stuck low, the pattern matching requirement for a successful detection pattern is much more exacting since it requires that opposite level test pattern bits be simultaneously applied to each of the faulty bit locations. UE detection becomes even more difficult when the faulty bit locations are not persistently stuck at particular levels, but instead fail intermittently.

A known solution to testing for and detecting UEs having multiple logic levels is to utilize multiple test patterns containing variations of alternating high and low bits. For example, a common set of patterns may include: 0x00000000, 0xFFFFFFFF, 0xAAAAAAAA, 0x55555555, 0xCCCCCCCC, 0x33333333, 0xF0F0F0F0, and 0x0F0F0F0F. The number and type of patterns are selected to achieve a desired coverage level for reliable UE detection.

While improving the reliability of detecting UEs having bad bits stuck at multiple logic levels, several problems remain unresolved. For example, if bit locations $b_n$ and $b_m$ are spread sufficient far apart and are stuck at opposite logic levels, many multi-pattern ECC tests will detect two single-bit errors rather than a multi-bit error. This occurs when the faulty bits stuck at opposite levels are farther apart than the cycle of repeating bits in each pattern. Conventional multi-pattern ECC testing also fails to adequately address the problem of intermittently occurring multiple-bit errors. For an intermittently occurring multiple-bit error, the multi-pattern testing sequence might detect less than all of the faulty bits per test pattern, so that one pattern may detect a perceived CE and a different pattern detects another incorrectly perceived CE. For both the bit spread issue and intermittent fault issue, increasing the number of patterns expands UE detection coverage, but also increases the costs associated with extra test pattern coverage.

It can therefore be appreciated that a need exists for a method, system, and computer program product that address problems relating to reliably and comprehensively detecting UEs with a limited test pattern cycle range. The present invention addresses this and other needs unresolved by the prior art.

SUMMARY OF THE INVENTION

A system, method and program product for utilizing error correction code (ECC) logic to detect multi-bit errors are disclosed herein. In one embodiment, a first test pattern and a second test pattern are applied to a set of hardware bit positions. The first and second patterns are multiple logic level patterns and the second test pattern is the logical complement of the first test pattern. The first and second test patterns are utilized by the ECC logic to detect correctable errors having n or fewer bits. One or more bit positions of a first correctable error occurring responsive to applying the first test pattern are determined and one or more bit positions of a second correctable error occurring responsive to applying the second test pattern are determined. The determined bit positions of the first and second correctable errors are processed to identify a multiple-bit error within the set of hardware bit positions.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 4A is a tabular representation of correctable error records utilized for multi-bit error detection in accordance with the invention; and FIG. 4B is a tabular representation of uncorrectable error records utilized for multi-bit error detection in accordance with the invention.

DETAILED DESCRIPTION OF ILLUSTRATIVE EMBODIMENT(S)

The present invention is directed to a method and system for utilizing correctable error (CE) analysis to identify otherwise undetected multi-bit errors. Specifically, and as depicted and described below with reference to the figures, the present invention utilizes CE and uncorrectable error (UE) logging mechanisms in combination with error detection mechanisms native to conventional error correction code (ECC) logic to detect multi-bit errors falling outside the scope of errors defined by the ECC logic as being correctable. In the depicted embodiments, the multi-bit error detection method and system are implemented within a memory system in which ECC logic is utilized to detect and correct errors within memory devices. It should be noted that the invention may be more widely applicable to other devices in which data is stored in and/or transported to and from designated hardware bit storage or transport devices such as in registers, buffers, bitlines, etc. that may be included in other than designated "memory" devices, such as processors, hardware controllers, buses, etc.

Figure 1:
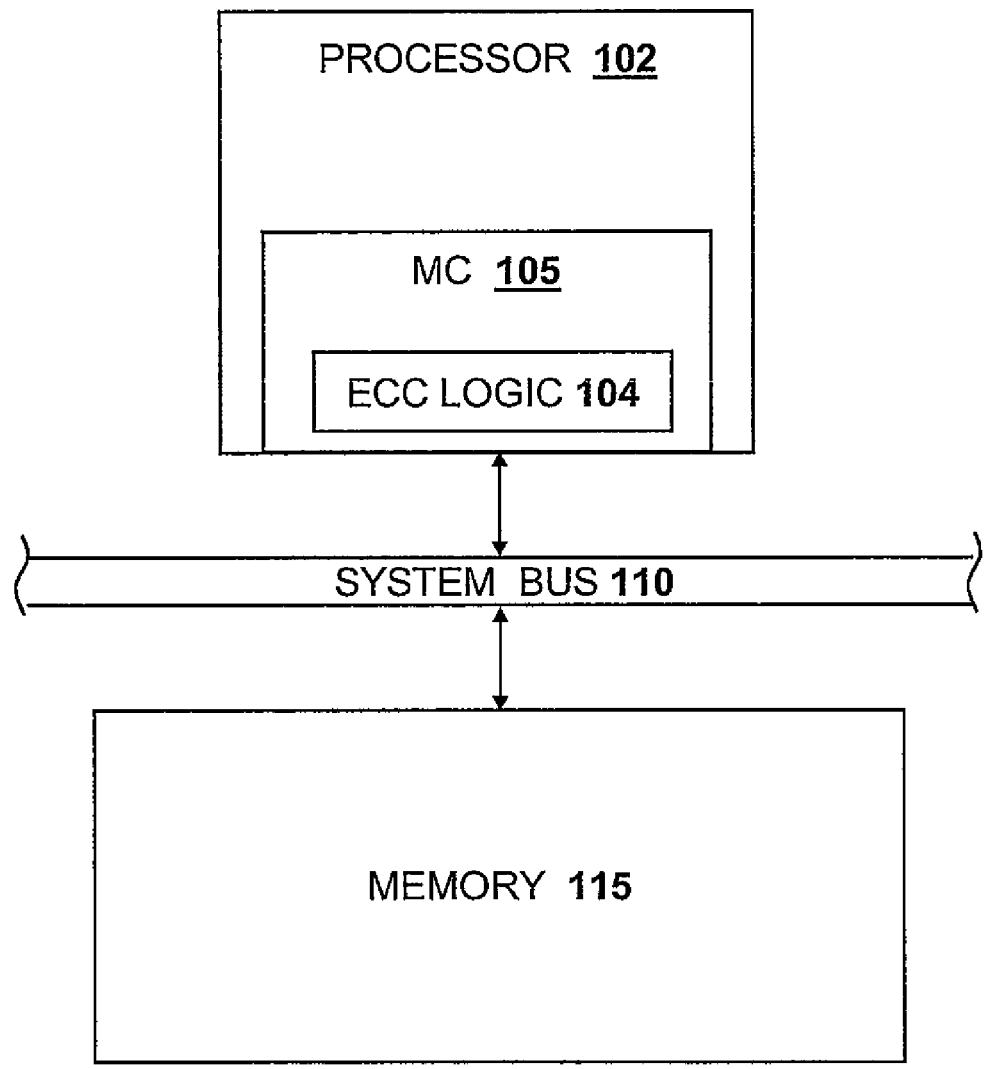
FIG. 1 is a high-level block diagram illustrating a memory system adapted for implementing multi-bit error detection in accordance with the present invention.

With reference now to the figures, wherein like reference numerals refer to like and corresponding parts throughout, and in particular with reference to FIG. 1, there is depicted a high-level block diagram illustrating a memory system 100 adapted for implementing multi-bit error detection in accordance with the present invention. Memory system 100 generally comprises one or more memory devices, collectively represented in FIG. 1 as a memory block 115. Consistent with well-known state of the art, memory 115 may comprise multiple physical and logical memory devices. The physical composition of memory 115 may include one or more physical memory chips mounted within memory chip installation packages such as dual in-line memory modules (DIMMS) each comprising multiple random access memory (RAM) integrated circuits (ICs). The constituent RAM ICs (not depicted) of memory 115 contains memory array structures comprising row and column structures. Memory lines within the array structure are designated to contain data and address bits. Memory 115 may further be physically and logically divided and designated within a specified memory architecture that may include a hierarchical cache memory structure as is familiar to those skilled in the art.

Memory 115 is coupled to a processor 102 via a system bus 110. Processor 102 includes a memory controller 105 which delivers read and write instructions via a memory controller 105 to write and read data to and from memory 115. During hardware testing using pre-specified test patterns or during non-test, routine system operations, an ECC logic module 104 within memory controller 105 is utilized to test the operational status and reliability of memory 115. During a single test pass, a specified test pattern containing test pattern bits and check bits is written to and read from the various memory arrays within memory 115 to determine the reliability of the one or more physical devices within memory 115. As explained in further detail below with reference to FIGS. 2, 3A, and 3B, ECC logic module 104 determines the operability of the devices within memory 115 in accordance with the results of at least two test pattern cycles in which the test patterns are multi-level (i.e. both logic high and low bits) and have mutually inverse (logically complementary) bit patterns. ECC testing utilizing ECC logic module 104 may be performed as a standard or selectable routine during system startup procedures such as during a boot initial program load memory diagnostics sequence.

In one embodiment, ECC logic module 104 employs Hamming codes to detect and, in some cases, to undertake corrective action for errors detected within one or more of the devices within memory 115. For an ECC test pattern cycle, test pattern data generated by ECC logic module 104 is sent from memory controller 105 and received by memory 115 via system bus 110 where it is stored in a physical memory array therein. The test pattern data includes the test pattern itself as well as check bits. Control circuitry within ECC logic module 104 computes the check bits from the pattern bits typically using exclusive or ("XOR") logic functions. The check bits are stored in the physical memory array within memory 115 along with the specified test pattern in accordance with well-known Hamming code techniques. The test cycle continues with a read operation in which the stored check bits, which in the case of Hamming codes comprise parity bits, are combined with the corresponding test pattern data read from the physical memory array again using XOR logic functions to detect errors. When used during system runtime operations, ECC logic module 104 further includes logic for correcting errors detected in the data before it is loaded into execution registers within processor 102. Such correctable errors are defined by the ECC logic as errors comprising a specified number of bits.

While ECC logic module 104 is depicted as incorporated within a processor mounted memory controller 105, it should be noted that alternate design configurations are possible without departing from the spirit or scope of the invention. For example, ECC logic module 104 may be implemented within ECC logic contained on a dedicated application specific IC (ASIC) or one of the memory devices such as within one or more DIMMs within memory 115 in alternate embodiments of the invention.

Figure 2:
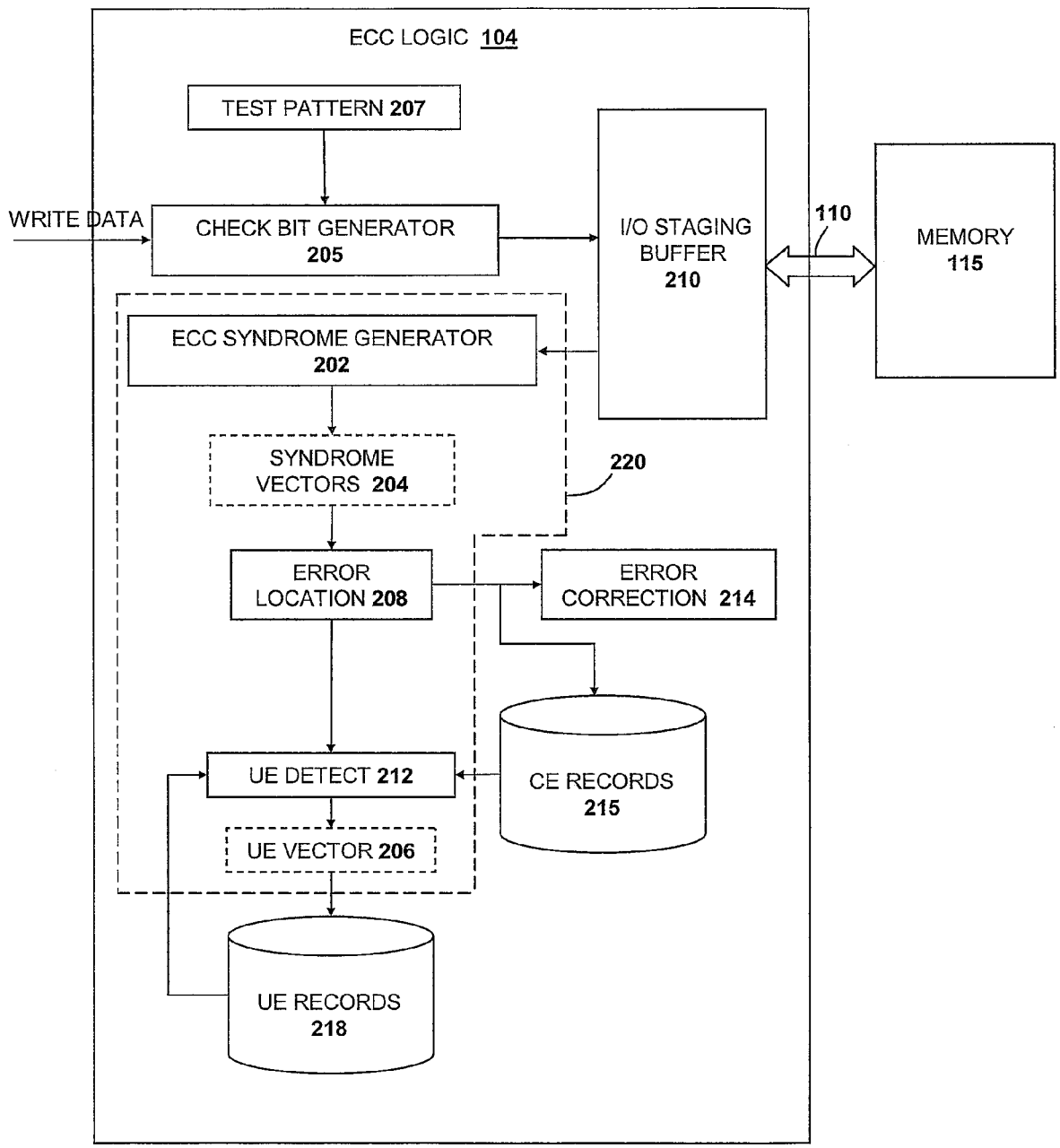
FIG. 2 is a more detailed block diagram depicting error correction code logic that may be implemented within the memory system shown in FIG. 1 in accordance with the present invention.

FIG. 2 is a more detailed block diagram depicting logic components of ECC logic module 104 in accordance with the invention. ECC logic module 104 includes error detection and correction logic and circuitry for detecting so-called correctable errors and uncorrectable errors. As utilized herein, a "correctable error" refers to an error that may be corrected by the ECC logic itself. Such correctable errors are defined in part as comprising n or less bits, wherein n is the ECC logic design specified upper limit on the maximum number of error bits that can be corrected for a given detected error. For example, a single error correction ECC defines correctable errors as single bit errors to the exclusion of all multiple bit errors. An uncorrectable error (UE) likewise refers generally to errors that may be detected but not corrected on a per pattern basis in accordance with conventional ECC logic convention. UEs may further refer to multi-bit errors detected across multiple ECC logic test runs in accordance with the devices and techniques disclosed herein. There are several known ECC schemes, with the most common being Single Error Correct Double Error Detect (SEC-DED).

ECC logic module 104 may be implemented within a processor mounted memory controller such as depicted in FIG. 1. In other embodiments, ECC logic module 104 may be included on a DIMM card along with one or more memory ICs, and may additionally or alternatively without limitation, be implemented within a dedicated ASIC module. In a preferred embodiment, write data passes through ECC logic module 104 prior to storage within memory 115. Likewise, read data fetched from memory 115 to system bus 110 passes through ECC logic module 104. Accordingly, the error detection/correction mechanism operates on test patterns and runtime data as it is being stored by the system in memory 115 as well as on the same stored patterns/data along with check bits as it is being read from memory 115.

During system runtime operations, data passed to memory 115 during a write operation passes first to an input/output (I/O) staging buffer 210 and to a check bit generator 205 within ECC logic module 104. Similarly for ECC test procedures, such as may be routinely performed during system startup, write pattern data is generated from a test pattern module 207. During a test cycle, the test pattern data passed to memory 115 during a write operation passes to I/O staging buffer 210 and check bit generator 205. I/O staging buffer 210 is a bidirectional buffer that controls the data movement in both directions between the system bus 110 and ECC logic module 104. During an ECC test cycle, the data received at I/O staging buffer 210 includes the test pattern bits as well as check bits generated by check bit generator 205 from the pattern. In this case, I/O staging buffer 210 has a word width that accommodates the data pattern and check bits. It will be understood by those skilled in the art that the principles underlying the present invention may be implemented in a manner consistent with the present description on system buses having a variety of widths.

Check bit generator circuit 205 includes logic for encoding test words that each include pattern bits and check bits. ECC check bit generator 205 generates and appends check bits (also referred to as parity bits) to a given Hamming code test pattern to be applied to the hardware bit positions under test such as within memory 115. Appending check bits to the test pattern, with each check bit corresponding to a subset of pattern bits, enables detection of multiple bit errors and also enables identification of the location of single or multiple bit errors. Once the test word has been buffered by I/O staging buffer 210, the buffered word may be delivered via system but 110 to memory 115, thereby completing the execution of the write operation.

Upon a subsequent issuance of a read command for the stored data word, the data word bits are read from a memory array structure within memory 115 in which they have been stored, into the I/O staging buffer 210. From I/O staging buffer 210, the check bits and test pattern bits are passed to an error detection unit 220. Error detection unit 220 generates check bits based on the retrieved word and compares the regenerated check bits to the stored check bits to determine whether there are any errors in the data word read from memory 115. Once the error determination has been completed, error detection unit 220 identifies the location of the erroneous bit(s), logs and corrects CEs and logs the occurrence of UEs as explained below in further detail.

The check bit regeneration and comparison functions are carried out within error detection unit 220 by a syndrome generator module 202. Syndrome generator module 202 generates a number of syndrome bits, represented in FIG. 2 as syndrome vector 204, that indicate whether any single or multiple-bit errors have occurred within the retrieved data word. As is known in the art of Hamming code ECC, the generation of the syndrome bits requires the regeneration of the check bits for the data word. If the syndrome bits within syndrome vector 204 are not all equal to zero then a single or multiple bit error has occurred. Once the non-zero syndrome bits have been generated they are decoded to locate the erroneous bit(s) so as to enable error correction.

The decoding of syndrome vector 204 is performed within error detection unit 220 by an error location unit 208 and UE detection unit 212. Syndrome vector 204 is passed to error location unit 208 where subsections of the data word which contain the detected errors are identified by decoding syndrome vectors 204 into location specific error indicators. Once the errors have been located they may be corrected via logic operations which are performed by an error correction unit 214. The error location data for correctable errors generated by error location unit 208 is logged within a set of CE records 215.

A more detailed and tabular representation of CE records 215 that may be utilized for multi-bit error detection in accordance with the invention is illustrated in FIG. 4A. As shown in FIG. 4A, CE records 215 include multiple row-wise CE record entries having column-wise data fields specifying various characteristics of each CE. In the depicted embodiment, each CE record contains data fields specifying the memory address of the location in memory that the error occurred and the particular bit location(s) of the error bit(s) within that memory address. For example, the first depicted row-wise CE entry specifies a single bit error having occurred at memory address line AA with the single bit error having occurred at bit location b1. In addition to the memory address and bit location data, each CE record entry includes data fields specifying the identity of the pattern used to detect the error, the identity of a test pattern having a bit pattern that is the logical complement of the test pattern, and the test cycle number.

Returning to FIG. 2, error detection unit 220 further includes UE detection unit 212 which detects errors that error correction unit 214 is incapable of correcting. Such uncorrectable errors are defined in part as comprising at least m bits where m is greater than the number of bits, n, that error correction unit 214 is designed to correct. UE detection within UE detection unit 212 is performed via a logic operation utilizing the error indicators generated by error location unit 208 and results in generation of UE vectors 206 that identify the location and bits included in each detected UE. UE vectors 206 are logged within a set of UE records 218 which are described below in further detail with reference to FIGS. 3B and 4B.

If error detection unit 220 identifies a correctable error (i.e. an error comprising n or less erroneous bits) during non-test, runtime operations in the data word, a corresponding error indicator is passed from error location unit 208 to error correction unit 214. Error correction unit 214 also receives the original data pattern word retrieved from I/O staging buffer 210. Error correction unit 214 converts the error indicator into an error pattern that is logically combined with the corresponding data subsection of the data word that contains the erroneous bit(s) thereby correcting the erroneous bits. The corrected word is thereafter used by the computer system completing the read operation.

Figure 3A:
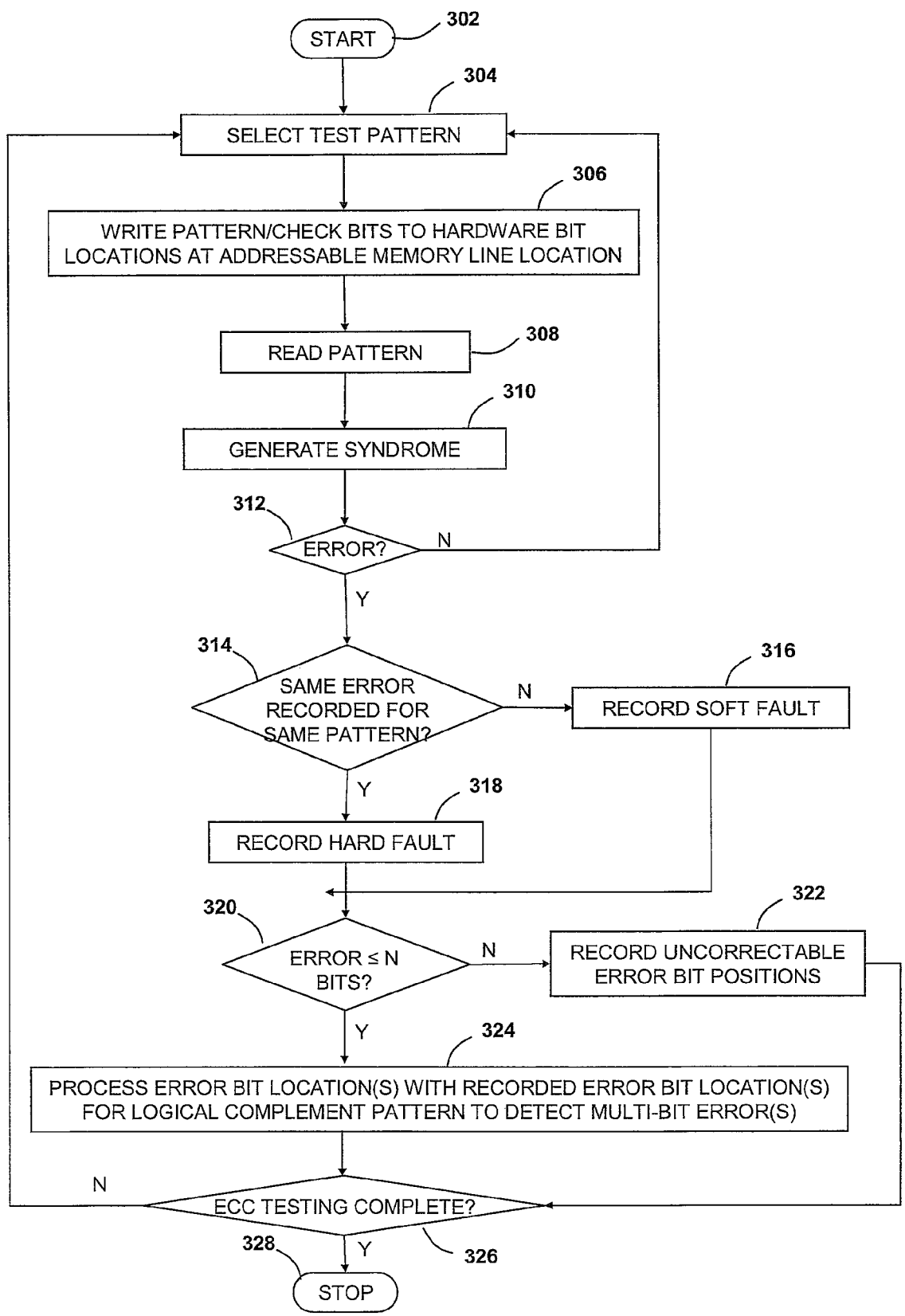
FIG. 3A is a high-level flow diagram illustrating steps performed during ECC test pattern processing in accordance with a preferred embodiment of the present invention.

In accordance with the present invention, a CE logging mechanism provided by error detection unit 220 is utilized for detecting uncorrectable errors that would otherwise remain undetected by UE detection unit 212. With reference now to FIG. 3A, there is depicted a high-level flow diagram illustrating steps performed by ECC logic module 104 during ECC test pattern processing in accordance with a preferred embodiment of the present invention. The process begins as shown at steps 302 and 304 with test pattern module 207 generating or selecting a test pattern having a specified bit pattern to be utilized in the present test cycle. Each pattern has a specified pattern and identifier which may be the bit pattern itself or coded designator as depicted in FIG. 4A. Test pattern module 207 preferably generates a series of at least two patterns that will each be processed in accordance with the steps described below. At least two of the test patterns have bit patterns that are mutually inverse. That is, and referring to FIGS. 2 and 4A, test pattern module 207 generates a pattern /x that is the logical complement of a pattern x that has been used for a given ECC test sequence. Furthermore, each of the selected patterns x and /x is a multi-level pattern (i.e. contains both binary logic levels). In this manner, and as explained in further detail below, multi-bit errors containing error bits at both levels can be detected across multiple test cycle runs.

Continuing as illustrated at step 306, the test data word comprising the selected test pattern bits and check bits generated by check bit generator 205 is written to a location within memory 115 having a known memory address. The test data word is then read from the physical bit locations within memory 115 (step 308) and received by syndrome generator 202 which generates an ECC syndrome therefrom (step 310).

The generated syndrome bits contained in syndrome vector 204 are processed by error location unit 208 to detect one or more error bits. If, as shown at steps 312 and 304, syndrome vector 204 reveals no errors, the ECC testing process continues with selecting and applying the next test pattern. In response to error location unit 208 detecting one or more error bits (i.e. the syndrome result reveals that one or more of the pattern bits have changed from the logic levels in the original pattern) at step 312, error location unit 208 accesses CE records 215 to determine whether or not the same error has been recorded using the current test pattern (step 314). Referring again to FIG. 4A, such a determination can be made by determining whether CE records 215 include a record for the same pattern as indicated in the PATTERN ID field, and if so, whether the same error bit(s) detecting at step 312 in the current test cycle is/are identified in the ERROR BITS field of the logged records. If the same pattern has been previously used but the currently detected bits were not previously detected as erroneous, a soft fault is recorded as shown at step 316. If it is determined that the same error has been previously recorded a hard fault is recorded as shown at step 318.

As previously explained and depicted with reference to FIG. 2, ECC logic module 104 includes units such as error location unit 208 and error correction unit 214 for detecting, locating, and correcting errors, referred to as correctable errors, characterized at least in part by having n or less bits. For single error correction, for example, n equals one and only single-bit errors are correctable. Errors for a given test pattern cycle having greater than n bits are detected by UE detection module 212. As depicted at steps 320 and 322, responsive to UE detection module 212 detecting a multi-bit error having greater than n bits, the UE and corresponding bit locations are recorded in UE records 218.

If, as illustrated at steps 320 and 324, the detected error is a correctable error comprising n or less bits, error location unit 208 records the error as a correctable error within CE records 215. Furthermore, the error bit location data for the detected error is comparatively processed with error bit location data for correctable errors recorded within CE records 215 to determine whether multi-bit errors for the same physical memory location can be detected. To this end, error location unit 208 determines whether the logical complement pattern of the present test pattern has been tested and whether the logical complement pattern revealed error bits different than the presently detected error bits. Following the processing of the current pattern, the process continues with the next pattern (steps 326 and 304) until ECC testing is complete and the process ends (step 328).

Figure 3B:
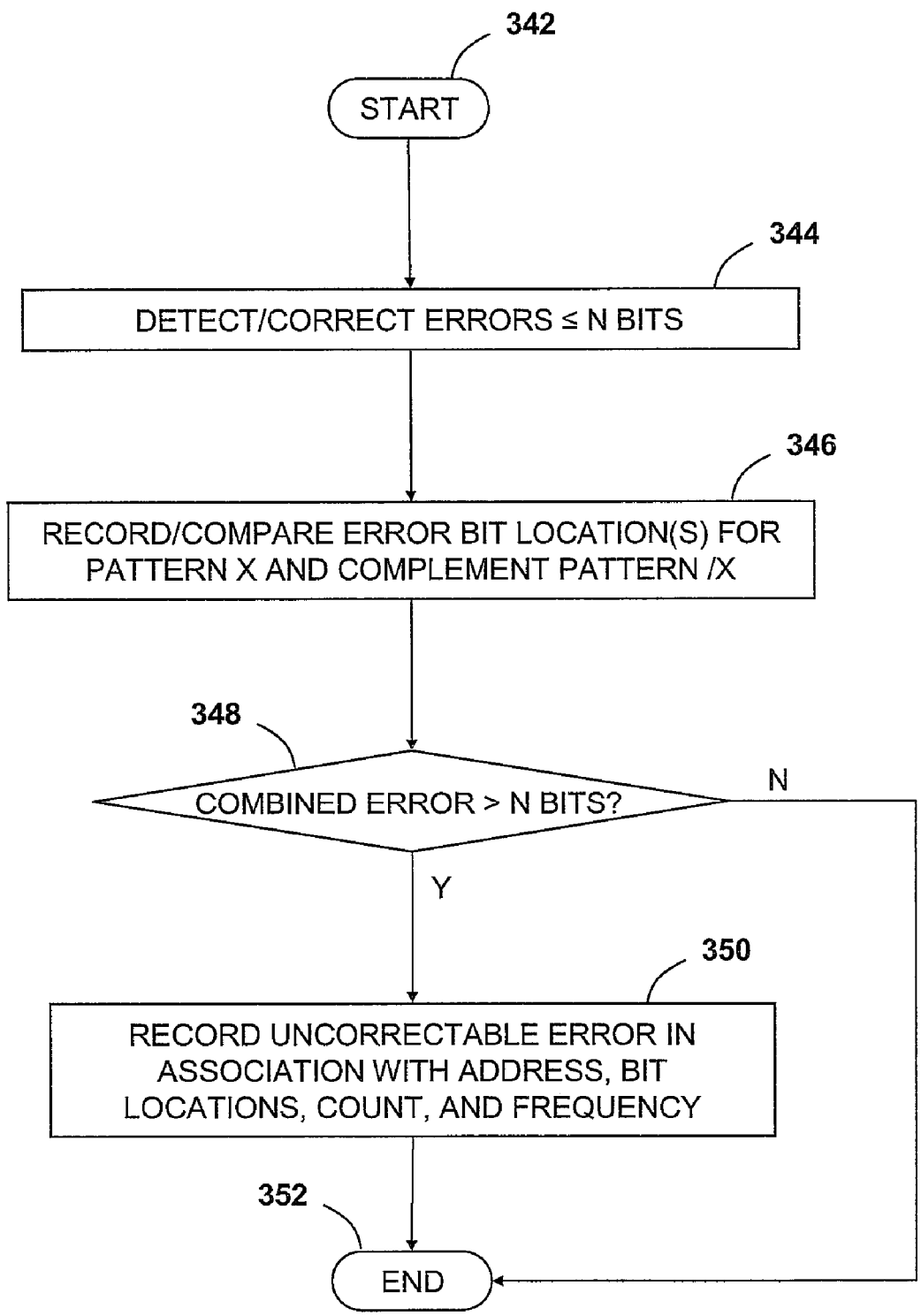
FIG. 3B is a high-level flow diagram depicting steps performed during multi-bit error detection in accordance with the invention.

The processing performed as part of step 324 of FIG. 3A is illustrated in further detail in FIG. 3B which depicts steps performed in association with multi-bit error detection in accordance with the invention. As shown in FIG. 3B, the multi-bit error detection process begins as illustrated at steps 342 and 344 with the detection and possible correction (during non-testing runtime operations) of a correctable error. The bit locations of the one or more detected error bits are recorded within CE records 215. As explained above with reference to step 304 in FIG. 3A, ECC patterns are selected such that at least two of the patterns are multi-level (i.e. having both logic high and low bits) and are mutually logically complementary. As illustrated at step 346, the error bit locations for patterns having mutually inverse logic levels are compared. If as shown at steps 348 and 352, the resultant combined number of error bits determined between a pattern and its complementary pattern is equal to or less than n, the error is correctable and the process ends. If, however, the resultant combined number of error bits determined between a pattern and its complementary pattern is greater than n, an uncorrectable error is recorded in UE records 218.

FIG. 4B is a tabular representation of uncorrectable error records such as may be contained in UE records 218 accordance with the invention. As shown in FIG. 4B, UE records 218 includes multiple row-wise UE record entries having column-wise data fields specifying various characteristics of each UE. As with the CE records, each UE record contains a data fields specifying the memory address of the location in memory where the error occurred and the particular bit location(s) of the error bit(s) within that memory address. For example, the first row-wise UE entry specifies a two-bit UE having occurred at memory address line BB with the errors having occurred at bit locations b0 and b7. The UE record entry further includes data fields specifying for each of error bits b0 and b7 a count, COUNT, of the number of occurrences of these same bit errors as well as the frequency, FREQ, with which these errors have occurred upon application of the same test patterns. In the depicted embodiment, the COUNT and FREQ fields for bits b0 and b7 specify that each bit position has failed four times and that data fields specifying the identity of the pattern used to detect the error, the identity of a test pattern having a bit pattern that is the logical complement of the test pattern as well as the test cycle number.

The disclosed methods may be readily implemented in software using object or object-oriented software development environments that provide portable source code that can be used on a variety of computer or workstation hardware platforms. In this instance, the methods and systems of the invention can be implemented as a routine embedded on a personal computer such as a Java or CGI script, as a resource residing on a server or graphics workstation, as a routine embedded in a dedicated source code editor management system, or the like.

While the invention has been particularly shown and described with reference to a preferred embodiment, it will be understood by those skilled in the art that various changes in form and detail may be made therein without departing from the spirit and scope of the invention. These alternate implementations all fall within the scope of the invention.

What is claimed is:

1. A method for utilizing error correction code (ECC) logic that detects and corrects correctable errors to detect multi-bit errors, said method comprising:

applying a first test pattern and a second test pattern to a set of hardware bit positions, wherein the second test pattern is the logical complement of the first test pattern, wherein the first and second test patterns are utilized by said ECC logic to detect correctable errors having n or fewer bits;

determining one or more bit positions of a first correctable error occurring responsive to applying the first test pattern;

determining one or more bit positions of a second correctable error occurring responsive to applying the second test pattern, wherein one or more of the bit positions of the second correctable error are different than the bit positions of the first correctable error;

processing the determined bit positions of the first and second correctable errors to identify a multiple-bit error within the set of hardware bit positions; and in response to detecting a multiple-bit error within the set of hardware bit positions resulting from the processing of the determined bit positions of the first and second correctable errors, recording an uncorrectable error record entry, wherein said uncorrectable error record entry includes:
- the bit positions of the first and second correctable errors; and
- the count and frequency of occurrence of each of the first and second correctable errors.

2. The method of claim 1, wherein said hardware bit positions comprise a memory line having a specified memory address, said applying a first test pattern and a second test pattern to the set of hardware bit positions comprising reading the first test pattern from the memory array bit positions at the specified memory address and subsequently reading the second test pattern from the memory array bit positions at the specified memory address.

3. The method of claim 2, said determining one or more bit positions of the first and second correctable errors comprising:
- generating a first correctable error syndrome from the first test pattern read from the memory line; and
- generating a second correctable error syndrome from the second test pattern read from the memory line.

4. The method of claim 1, wherein:
- the first and second test patterns each include test data bits and parity check bits; and
- the method further comprises calculating the parity check bits from the test data bits.

5. The method of claim 1, wherein said first correctable error contains at least one error bit that is the logical complement of at least one error bit in said second correctable error.

6. The method of claim 1, wherein a correctable error is defined by said ECC logic as including n or fewer bits, and wherein said processing the determined bit positions of the first and second correctable errors comprises comparing the bit locations of the first correctable error with the bit locations of the second correctable error to determine whether the first and second correctable errors in combination indicate an m-bit error, wherein m is greater than n.

7. A system for utilizing error correction code (ECC) logic that detects and corrects correctable errors to detect multi-bit errors, said system comprising:
- an ECC logic module that applies a first test pattern and a second test pattern to a set of hardware bit positions, wherein the second test pattern is the logical complement of the first test pattern, wherein the first and second test patterns are utilized by said ECC logic to detect correctable errors having n or fewer bits;
- an error detection unit that determines one or more bit positions of a first correctable error occurring responsive to applying the first test pattern, said error detection unit determining one or more bit positions of a second correctable error occurring responsive to applying the second test pattern, wherein one or more of the bit positions of the second correctable error are different than the bit positions of the first correctable error;
- uncorrectable error storage; and
- an uncorrectable error unit that processes the determined bit positions of the first and second correctable errors to identify a multiple-bit error within the set of hardware bit positions and that, responsive to detection of the multiple-bit error within the set of hardware bit positions, records an uncorrectable error record entry in the uncorrectable error storage, wherein said uncorrectable error record entry includes:
  - the bit positions of the first and second correctable errors; and
  - the count and frequency of occurrence of each of the first and second correctable errors.

8. The system of claim 7, wherein said hardware bit positions comprise a memory line having a specified memory address, wherein said ECC logic module reads the first test pattern from the memory array bit positions at the specified memory address and subsequently reads the second test pattern from the memory array bit positions at the specified memory address.

9. The system of claim 8, said error detection unit comprising a syndrome generator that generates a first correctable error syndrome from the first test pattern read from the memory line, said syndrome generator generating a second correctable error syndrome from the second test pattern read from the memory line.

10. The system of claim 7, wherein:
- the first and second test patterns each include test data bits and parity check bits; and
- the system further includes a check bit generator that generates the parity check bits from the test data bits.

11. The system of claim 7, wherein said first correctable error contains at least one error bit that is the logical complement of at least one error bit in said second correctable error.

12. The system of claim 7, wherein a correctable error is defined by said ECC logic as including n or fewer bits, and wherein said uncorrectable error unit compares the bit locations of the first correctable error with the bit locations of the second correctable error to determine whether the first and second correctable errors in combination indicate an m-bit error, wherein m is greater than n.

13. A computer-readable data storage medium having encoded thereon computer-executable instructions for utilizing error correction code (ECC) logic that detects and corrects correctable errors to detect multi-bit errors, said computer-executable instructions adapted to cause a computer to perform:
- applying a first test pattern and a second test pattern to a set of hardware bit positions, wherein the second test pattern is the logical complement of the first test pattern, wherein the first and second test patterns are utilized by said ECC logic to detect correctable errors having n or fewer bits;
- determining one or more bit positions of a first correctable error occurring responsive to applying the first test pattern;
- determining one or more bit positions of a second correctable error occurring responsive to applying the second test pattern, wherein one or more of the bit positions of the second correctable error are different than the bit positions of the first correctable error;
- processing the determined bit positions of the first and second correctable errors to identify a multiple-bit error within the set of hardware bit positions; and
- in response to detecting a multiple-bit error within the set of hardware bit positions resulting from the processing of the determined bit positions of the first and second correctable errors, recording an uncorrectable error record entry, wherein said uncorrectable error record entry includes:
  - the bit positions of the first and second correctable errors; and
  - the count and frequency of occurrence of each of the first and second correctable errors.

14. The computer-readable data storage medium of claim 13, wherein said hardware bit positions comprise a memory line having a specified memory address, said applying a first test pattern and a second test pattern to the set of hardware bit positions comprising reading the first test pattern from the memory array bit positions at the specified memory address and subsequently reading the second test pattern from the memory array bit positions at the specified memory address.

15. The computer-readable data storage medium of claim 14, said determining one or more bit positions of the first and second correctable errors comprising:

generating a first correctable error syndrome from the first test pattern read from the memory line; and generating a second correctable error syndrome from the second test pattern read from the memory line.

16. The computer-readable data storage medium of claim 13, wherein:

the first and second test patterns each include test data bits and parity check bits; and the computer-executable instructions cause the computer to calculate the parity check bits from the test data bits.

17. The computer-readable data storage medium of claim 13, wherein said first correctable error contains at least one error bit that is the logical complement of at least one error bit in said second correctable error.

18. The computer-readable data storage medium of claim 13, wherein a correctable error is defined by said ECC logic as including n or fewer bits, and wherein said processing the determined bit positions of the first and second correctable errors comprises comparing the bit locations of the first correctable error with the bit locations of the second correctable error to determine whether the first and second correctable errors in combination indicate an m-bit error, wherein m is greater than n.

* * * * *